United States Patent
Xiao

(10) Patent No.: US 11,380,718 B2
(45) Date of Patent: Jul. 5, 2022

(54) DISPLAY PANEL AND METHOD OF MANUFACTURING SAME

(71) Applicant: Shenzhen CHINA STAR OPTOELECTRONICS SEMICONDUCTOR DISPLAY TECHNOLOGY CO., LTD., Guangdong (CN)

(72) Inventor: Hui Xiao, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 339 days.

(21) Appl. No.: 16/623,325

(22) PCT Filed: Nov. 8, 2019

(86) PCT No.: PCT/CN2019/116656
§ 371 (c)(1),
(2) Date: Dec. 16, 2019

(87) PCT Pub. No.: WO2021/051509
PCT Pub. Date: Mar. 25, 2021

(65) Prior Publication Data
US 2021/0335852 A1 Oct. 28, 2021

(30) Foreign Application Priority Data

Sep. 16, 2019 (CN) .......................... 201910868987.1

(51) Int. Cl.
*H01L 27/12* (2006.01)
*H01L 27/15* (2006.01)
*H01L 27/32* (2006.01)

(52) U.S. Cl.
CPC ...... *H01L 27/1255* (2013.01); *H01L 27/1248* (2013.01); *H01L 27/1259* (2013.01);
(Continued)

(58) Field of Classification Search
None
See application file for complete search history.

(56) References Cited

U.S. PATENT DOCUMENTS

| 6,316,294 B1 | 11/2001 | Yoon et al. |
| 2004/0144982 A1 | 7/2004 | Yamazaki et al. |

(Continued)

FOREIGN PATENT DOCUMENTS

| CN | 1893116 A | 1/2007 |
| CN | 103199113 A | 7/2013 |

(Continued)

OTHER PUBLICATIONS

Machine-generated English translation of CN109585520A, total pp. 14 (Year: 2019).*

(Continued)

*Primary Examiner* — Bo B Jang

(57) ABSTRACT

A display panel and a method of manufacturing of the same are provided. The display panel includes a substrate and an active layer disposed on the substrate. The active layer includes a conductive and transparent first plate, and the first plate is provided with a dielectric layer. The dielectric layer is provided with a second plate, and the second plate and the dielectric layer are made of a transparent conductive material.

4 Claims, 4 Drawing Sheets

(52) U.S. Cl.
CPC ........ *H01L 27/1225* (2013.01); *H01L 27/156* (2013.01); *H01L 27/3265* (2013.01); *H01L 2227/323* (2013.01)

(56) References Cited

U.S. PATENT DOCUMENTS

| | | |
|---|---|---|
| 2007/0007524 A1 | 1/2007 | You et al. |
| 2015/0255618 A1 | 9/2015 | Chen et al. |
| 2015/0303222 A1 | 10/2015 | Ning |
| 2018/0248032 A1 | 8/2018 | Zhou |
| 2019/0386035 A1* | 12/2019 | Li .................... H01L 27/3246 |

FOREIGN PATENT DOCUMENTS

| | | | |
|---|---|---|---|
| CN | 103646966 A | | 3/2014 |
| CN | 105514116 A | | 4/2016 |
| CN | 109166895 A | | 1/2019 |
| CN | 109585520 A | * | 4/2019 |
| JP | 2002050633 A | | 2/2002 |

OTHER PUBLICATIONS

Machine-generated English translation of CN109166895A, total pp. 12 (Year: 2019).*

\* cited by examiner

DISPLAY PANEL AND METHOD OF MANUFACTURING SAME

FIELD OF INVENTION

The present disclosure relates to the field of display technologies, and more particularly to a display panel and a method of manufacturing the same.

BACKGROUND OF INVENTION

In an oxide thin film transistor (oxide TFT) industry, as shown in FIG. 1, in a display panel, a part of a semiconductor layer 11 made of indium gallium zinc oxide (IGZO) is conductorized. A storage capacitor is composed of a light blocking layer 12, a first metal conductive layer 13, and a second metal conductive layer 14.

However, because the light blocking layer 12, the first metal conductive layer 13, and the second metal conductive layer 14 have poor light transmittance, they cannot be applied to the field of transparent display.

In the display panel, because a plate constituting the storage capacitor is inferior in light transmittance, it cannot be applied to the field of transparent display.

SUMMARY OF INVENTION

An embodiment of the present application provides a display panel. The display panel includes a substrate; a buffer layer disposed on the substrate; an active layer disposed on the buffer layer; a gate insulating layer and a gate metal layer stacked on the active layer; an interlayer dielectric layer disposed on the buffer layer and covering the gate metal layer; a second metal layer disposed on the interlayer dielectric layer; a passivation layer and a planarization layer stacked on the interlayer dielectric layer; and an anode metal layer, a light emitting layer, and a cathode metal layer stacked on the planarization layer; wherein the active layer comprises a conductive and transparent first plate, the first plate is provided with a dielectric layer, the dielectric layer is provided with a second plate, the second plate and the dielectric layer are made of a transparent conductive material; the second plate is made of indium tin oxide; the planarization layer is provided with an opening extending to the first plate, and the second plate is disposed in the opening.

In an embodiment of the present application, the active layer further comprises an active island independent of the first plate, the active island comprises a conductor layer and a semiconductor layer corresponding to and in contact with the gate insulating layer, the conductor layer is provided with a protective layer, the second metal layer comprises a source/drain metal layer, and the source/drain metal layer is in contact with the conductor layer through the protective layer.

In an embodiment of the present application, the gate metal layer is also provided with the protective layer covering the gate metal layer.

In an embodiment of the present application, the protective layer and the dielectric layer are made of aluminum oxide.

An embodiment of the present application provides a display panel, comprising: a substrate; a buffer layer disposed on the substrate; an active layer disposed on the buffer layer; a gate insulating layer and a gate metal layer stacked on the active layer; an interlayer dielectric layer disposed on the buffer layer and covering the gate metal layer; a second metal layer disposed on the interlayer dielectric layer; a passivation layer and a planarization layer stacked on the interlayer dielectric layer; and an anode metal layer, a light emitting layer, and a cathode metal layer stacked on the planarization layer; wherein the active layer comprises a conductive and transparent first plate, the first plate is provided with a dielectric layer, the dielectric layer is provided with a second plate, the second plate and the dielectric layer are made of a transparent conductive material.

In an embodiment of the present application, the second plate is made of indium tin oxide.

In an embodiment of the present application, the planarization layer is provided with an opening extending to the first plate, and the second plate is disposed in the opening.

In an embodiment of the present application, the active layer further comprises an active island independent of the first plate, the active island comprises a conductor layer and a semiconductor layer corresponding to and in contact with the gate insulating layer, the conductor layer is provided with a protective layer, the second metal layer comprises a source/drain metal layer, and the source/drain metal layer is in contact with the conductor layer through the protective layer.

In an embodiment of the present application, the gate metal layer is also provided with the protective layer covering the gate metal layer.

In an embodiment of the present application, the protective layer and the dielectric layer are made of aluminum oxide.

An embodiment of the present application further provides a method of manufacturing a display panel, comprising steps of: S10, forming a buffer layer on the substrate; S20, forming a patterned active layer on the buffer layer by using indium gallium zinc oxide, the active layer comprising an active island and a first plate independent of the active island; S30, sequentially forming a gate insulating layer and a gate metal layer on the active island; S40, conducting a portion of the active island exposing the gate insulating layer to form a conductor layer, simultaneously conducting the first plate, forming a protective layer covering the conductor layer, and forming a dielectric layer covering the first plate; S50, forming an interlayer dielectric layer covering the active layer and the gate metal layer; S60, forming a second metal layer on the interlayer dielectric layer, and patterning the second metal layer to form a source/drain metal layer in contact with the conductor layer; S70, forming a passivation layer and a planarization layer on the interlayer dielectric layer; S80, forming an anode metal layer in contact with the source/drain metal layer on the planarization layer by using indium tin oxide, and simultaneously forming a second plate on the dielectric layer to form a storage capacitor with the first plate; and 890, forming a light emitting layer and a cathode metal layer on the anode metal layer.

In an embodiment of the present application, the step S40 comprises: S41, forming a thin film from aluminum and/or aluminum oxide on the first plate and the portion of the active island exposing the gate insulating layer; and S42, thermally annealing the thin film in an oxygen-containing environment, diffusing aluminum molecules into the first plate and the portion of the active island exposing the gate insulating layer to form a conductor layer where the portion of the active island exposes the gate insulating layer and to form a conductive and transparent first plate, and simultaneously diffusing oxygen atoms in the active layer into the thin film to form a protective layer covering the conductor layer and to form a dielectric layer covering the first plate.

In an embodiment of the present application, the protective layer is formed on the gate metal layer while forming the protective layer on the conductor layer.

In an embodiment of the present application, the step S80 comprises: S81, forming a hole extending to a surface of the source/drain metal layer and an opening extending to the dielectric layer on the planarization layer; and S82, forming an anode metal layer filling the hole on the planarization layer by using indium tin oxide, and simultaneously forming a second plate on the dielectric layer in the opening to form a storage capacitor with the first plate.

Beneficial effects of the present application are that: indium gallium zinc oxide is converted from a semiconductor to a conductor by interdiffusion of an aluminum atom and an oxygen atom in the indium gallium zinc oxide to form a conductor layer. In addition, structurally dense aluminum oxide is formed on a surface of the conductor layer, indium gallium zinc oxide, indium tin oxide, and aluminum oxide are transparent conductive materials, so that a storage capacitor itself becomes transparent and can be widely applied in the field of transparent display. Moreover, the structure of the aluminum oxide is dense, and the conductor layer and the first plate can be well protected, so that the conductor layer and the first plate are protected from a subsequent thermal process. In addition, aluminum oxide has a high impedance and can increase the storage capacitance per unit area of the storage capacitor.

DESCRIPTION OF DRAWINGS

In order to more clearly illustrate the technical solutions in the embodiments of the present application, the drawings used in the description of the embodiments will be briefly described below. It is obvious that the drawings in the following description are only some embodiments of the present application. Other drawings can also be obtained from those skilled in the art based on these drawings without paying any creative effort.

Figure 1:
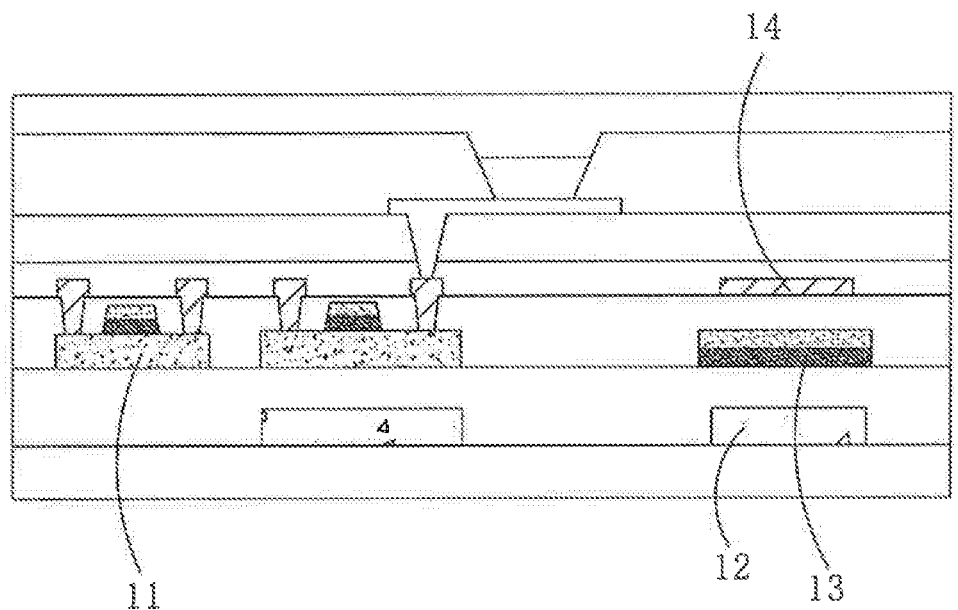
FIG. 1 is a schematic structural view of a display panel in the background art of the present invention.

REFERENCE NUMERAL 11 a semiconductor layer; 12 a light blocking layer; 13 a first metal conductive layer; 14 a second metal conductive layer;

20 substrate; 30 buffer layer; 40 active layer; 41 active island; 411 conductor layer; 42 first plate; 50 gate insulating layer; 60 gate metal layer; 70 interlayer dielectric layer; 80, second metal layer; 91 anode metal layer; 92 second plate; 101 passivation layer; 102 planarization layer; 103 pixel defining layer; 104 light emitting layer; 105 cathode metal layer; 106 protective layer; 107 dielectric layer; 108 light shielding layer; 109 opening.

DETAILED DESCRIPTION OF PREFERRED EMBODIMENTS

A specific embodiment of the present application. The directional terms mentioned in the present invention, such as up, down, front, back, left, right, inside, outside, side, etc., are merely directions referring to the drawings. Therefore, the directional terminology used is for the purpose of illustration and understanding of the present invention. In the figures, structurally similar elements are denoted by the same reference numerals.

In conventional display panels, because a plate constituting a storage capacitor is inferior in light transmittance, it cannot be applied to the field of transparent display. The present invention can solve the above issues.

Figure 2:
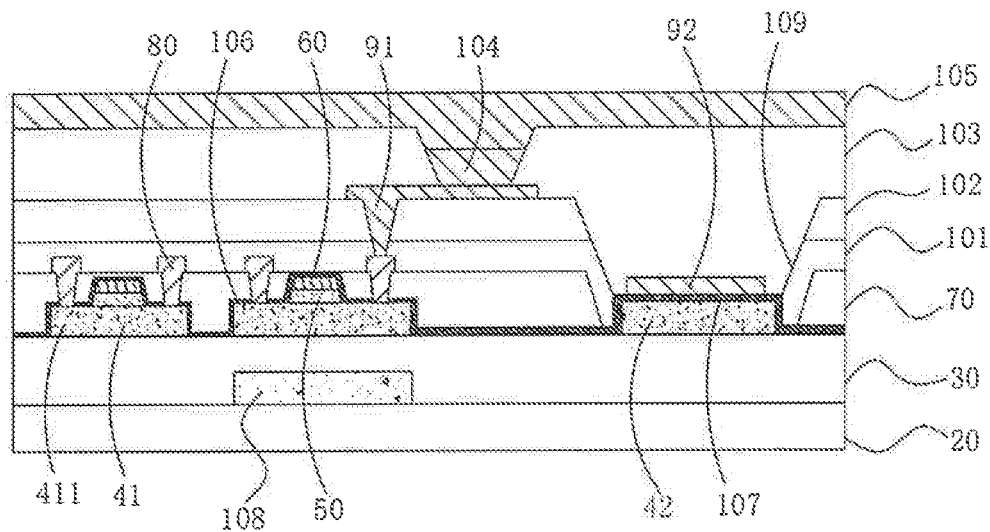
FIG. 2 is a schematic structural view of a display panel according to an embodiment of the present invention.

A display panel, as shown in FIG. 2, includes a substrate 20, a light shielding layer 108 and a buffer layer 30 disposed on the substrate 20, an active layer 40 disposed on the buffer layer 30, a gate insulating layer 50 and a gate metal layer 60 stacked on the active layer 40, an interlayer dielectric layer 70 disposed on the buffer layer 30 and covering the gate metal layer 60, and a second metal layer 8 disposed on the interlayer dielectric layer 70.

A passivation layer 101 and a planarization layer 102 are further stacked on the interlayer dielectric layer 70. A pixel defining layer 103 and an anode metal layer 91 are further disposed on the planarization layer 102. A light emitting layer 104 and a cathode metal layer 105 are stacked on the anode metal layer 91.

The active layer 40 includes a conductive and transparent first plate 42. The first plate 42 is provided with a dielectric layer 107, and the dielectric layer 107 is provided with a second plate 92. The second plate 92 and the dielectric layer 107 are made of a transparent conductive material, and the first plate 42 and the second plate 92 form a storage capacitor.

The first plate 42, the second plate 92, and the dielectric layer 107 disposed between the first plate 42 and the second plate 92 forming the storage capacitor are all made of a transparent material. The storage capacitor itself becomes transparent and can be applied to the field of transparent display.

Further, the planarization layer 102 is provided with an opening 109 extending to the first plate 42, and the second plate 92 is disposed in the opening 109.

In details, the active layer 40 further comprises an active island 41 independent of the first plate 42, the active island 41 comprises a conductor layer 411 and a semiconductor layer 11 corresponding to and in contact with the gate insulating layer 50, the conductor layer 411 is provided with a protective layer 106, the second metal layer 80 comprises a source/drain metal layer, and the source/drain metal layer is in contact with the conductor layer 411 through the protective layer 106.

The conductor layer 411 is covered by the protective layer 106 to function as a heat insulator to prevent the subsequent thermal process from increasing impedance of the conductor layer 411. This protects the conductor layer 411 from the subsequent thermal process and improves thermal stability of the conductor layer 411.

Further, the protective layer 106 covering the gate metal layer 60 is also disposed on the gate metal layer 60.

Specifically, the active layer 40 is made of indium gallium zinc oxide. The second plate 92 is made of indium tin oxide. The protective layer 106 and the dielectric layer 107 are made of aluminum oxide.

Indium gallium zinc oxide, indium tin oxide, and aluminum oxide are transparent conductive materials, so that a storage capacitor itself becomes transparent and can be widely applied in the field of transparent display. Moreover, the structure of the aluminum oxide is dense, and the conductor layer 411 and the first plate 42 can be well protected, so that the conductor layer 411 and the first plate 42 are protected from a subsequent thermal process. In addition, aluminum oxide has a high impedance and can increase the storage capacitance per unit area of the storage capacitor.

Figure 3:
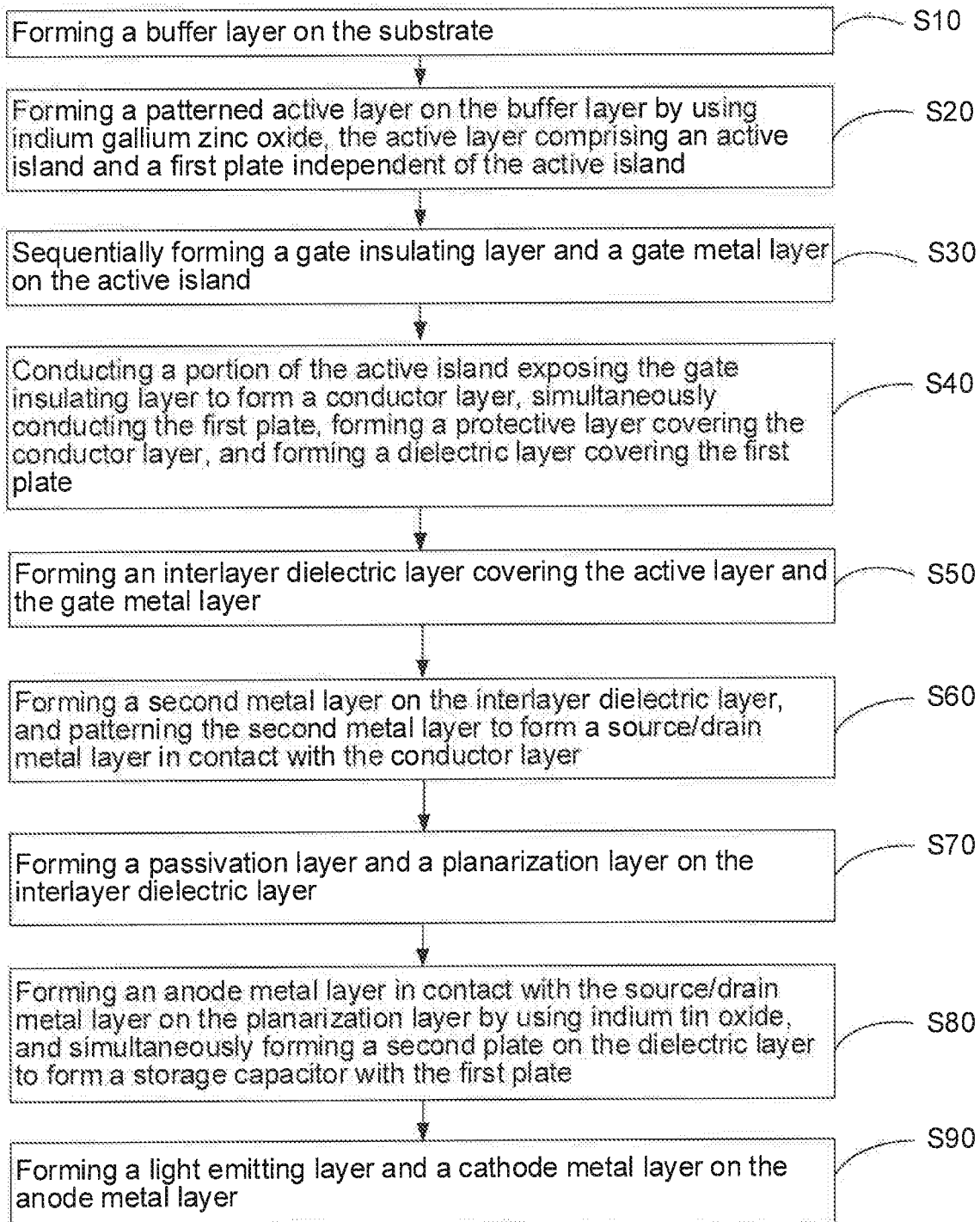
FIG. 3 is a schematic view showing steps of manufacturing a display panel according to an embodiment of the present invention.

According to the above display panel, an embodiment of the present invention further provides a method of manufacturing a display panel, as shown in FIG. 3, comprising the following steps:

Step S10, forming a buffer layer 30 on the substrate 20.

Step S20, forming a patterned active layer 40 on the buffer layer 30 by using indium gallium zinc oxide, the active layer 40 comprising an active island 41 and a first plate 42 independent of the active island 41.

Step S30, sequentially forming a gate insulating layer 50 and a gate metal layer 60 on the active island 41.

Step S40, conducting a portion of the active island 41 exposing the gate insulating layer 50 to form a conductor layer 411, simultaneously conducting the first plate 42, forming a protective layer 106 covering the conductor layer 411, and forming a dielectric layer 107 covering the first plate 42.

Step S50, forming an interlayer dielectric layer 70 covering the active layer 40 and the gate metal layer 60.

Step S60, forming a second metal layer 80 on the interlayer dielectric layer 70, and patterning the second metal layer 80 to form a source/drain metal layer in contact with the conductor layer 411.

Step S70, forming a passivation layer 101 and a planarization layer 102 on the interlayer dielectric layer 70.

Step S80, forming an anode metal layer 91 in contact with the source/drain metal layer on the planarization layer 102 by using indium tin oxide, and simultaneously forming a second plate 62 on the dielectric layer 107 to form a storage capacitor with the first plate 42.

Step S90, forming a light emitting layer 104 and a cathode metal layer 105 on the anode metal layer 91.

The step S40 comprises:

Step S41, forming a thin film from aluminum and/or aluminum oxide on the first plate 42 and the portion of the active island 41 exposing the gate insulating layer 50.

Step S42, thermally annealing the thin film in an oxygen-containing environment, diffusing aluminum molecules into the first plate 42 and the portion of the active island 41 exposing the gate insulating layer 50 to form a conductor layer 411 where the portion of the active island 41 exposes the gate insulating layer 50 and to form a conductive and transparent first plate 42, and simultaneously diffusing oxygen atoms in the active layer 40 into the thin film to form a protective layer 106 covering the conductor layer 411 and to form a dielectric layer 107 covering the first plate 42.

Further, the protective layer 106 is formed on the gate metal layer 60 while forming the protective layer 106 on the conductor layer 411.

The protective layer 106 and the dielectric layer 107 are made of aluminum oxide.

In details, the step S80 comprises:

Step S81, forming a hole extending to a surface of the source/drain metal layer and an opening 109 extending to the dielectric layer 107 on the planarization layer 102.

Step S82, forming an anode metal layer 91 filling the hole on the planarization layer 102 by using indium tin oxide, and simultaneously forming a second plate 92 on the dielectric layer 107 in the opening 109 to form a storage capacitor with the first plate 42.

Referring to FIG. 4 to FIG. 9, FIG. 4 to FIG. 9 are schematic views showing a manufacturing process of the display panel.

Figure 4:
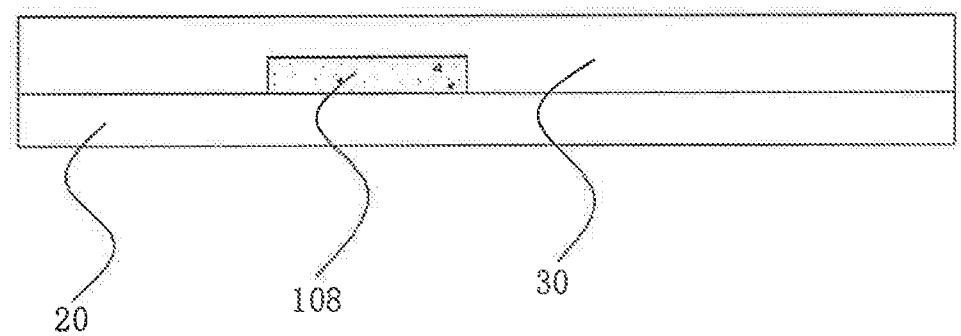
FIG. 4 to FIG. 9 are schematic views showing a manufacturing process of a display panel according to an embodiment of the present invention.

As shown in FIG. 4, after a light shielding layer 108 is formed on the substrate 20, the buffer layer 30 covering the light shielding layer 108 is formed.

Figure 5:
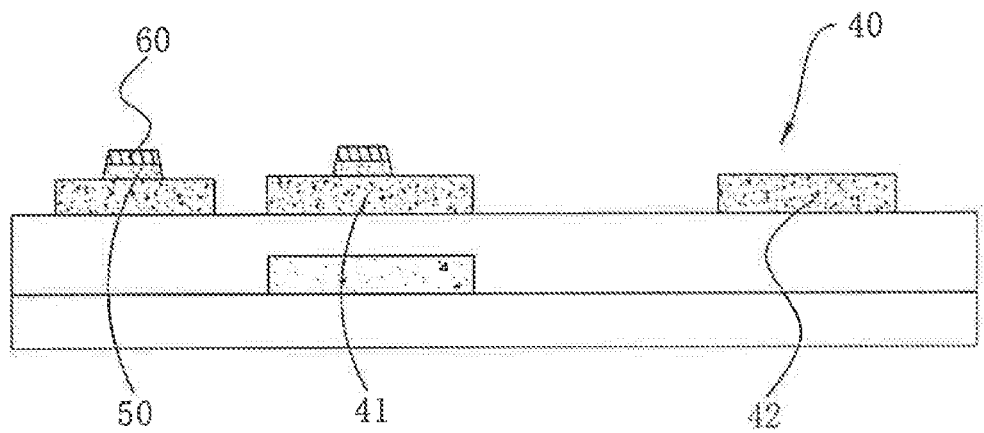

As shown in FIG. 5, the active layer 40 is formed on the buffer layer 30, and the active layer 40 is patterned. After the active island 41 and the first plate 42 independent of the active island 41 are formed, the gate insulating layer 50 and the gate metal layer 60 are sequentially stacked on the active island 41.

Figure 6:
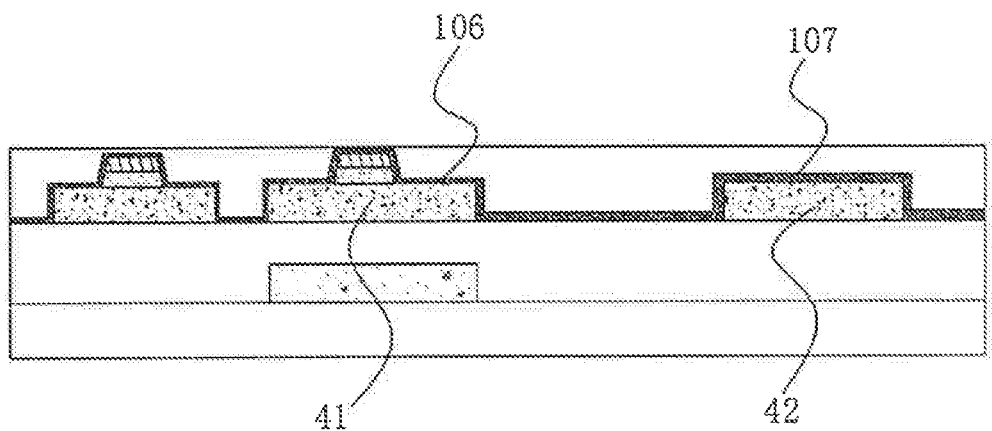

As shown in FIG. 6, a thin film covering the active layer 40 and the gate metal layer 60 is formed by sputtering using an aluminum and/or aluminum oxide target or by using an ALD machine. Thermal annealing is performed in an oxygen-containing environment to diffuse aluminum atoms into the active layer 40 to form a conductor layer 411, and a conductive and transparent first plate 42 is formed. Further, oxygen atoms in the active layer 40 are diffused into the thin film to form a protective layer 106 covering the conductor layer 411 and to form a dielectric layer 107 covering the first plate 42.

Subsequently, an interlayer dielectric layer 70 covering the active layer 40 and the gate metal layer 60 is formed using a silicon oxide material.

Figure 7:
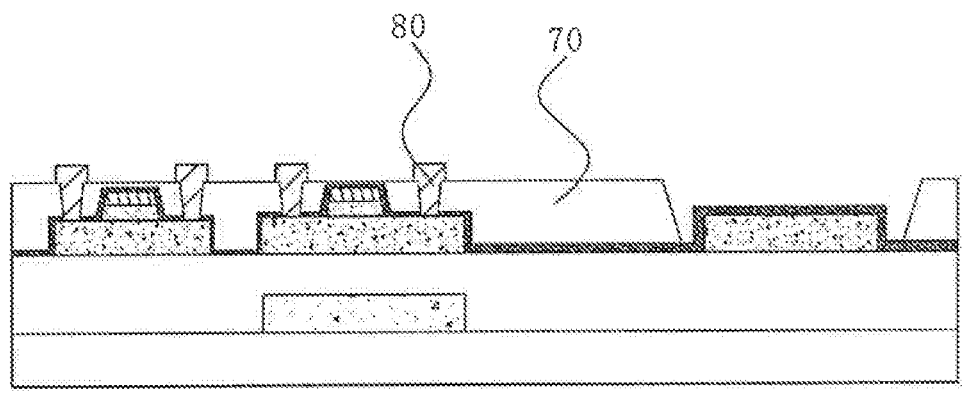

As shown in FIG. 7, an overlapping hole is dug at a position corresponding to the conductor layer 411 on the interlayer dielectric layer 70, and the protective layer 106 on the conductor layer 411 corresponding to the overlapping hole is removed. In addition, a groove is formed in the interlayer dielectric layer 70 at a position corresponding to the first plate 42 to expose the dielectric layer 107 on the first plate 42. A second metal layer 80 filling the overlapping hole is formed on the interlayer dielectric layer 70. The second metal layer 80 is patterned to form a source/drain metal layer in contact with the conductor layer 411.

Figure 8:
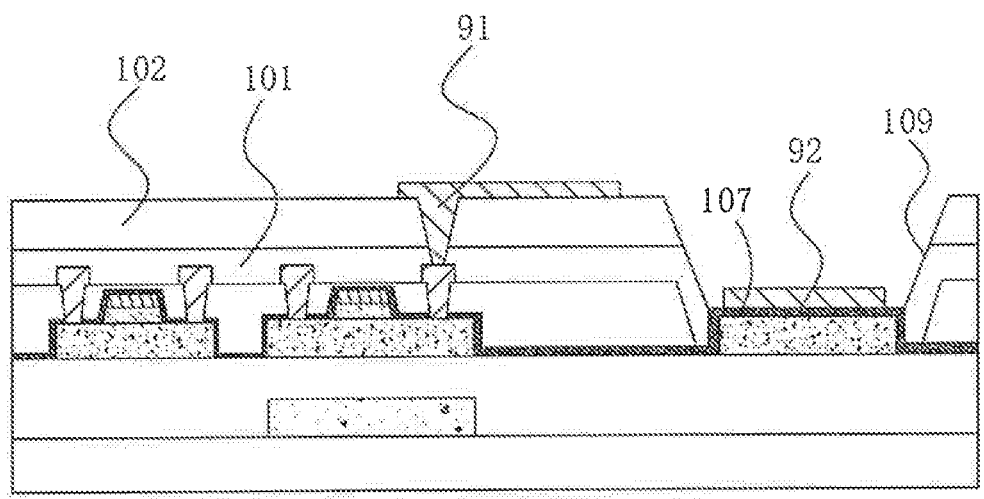

As shown in FIG. 8, a passivation layer 101 and a planarization layer 102 are sequentially stacked on the interlayer dielectric layer 70. A hole extending to a surface of the source/drain metal layer and an opening 109 extending to the dielectric layer 107 are formed on the planarization layer 102 to expose the dielectric layer 107.

Subsequently, a transparent conductive metal layer filled with a hole is formed on the planarization layer 102 and the dielectric layer 107 using indium tin oxide. The transparent conductive metal layer is patterned to form an anode metal layer 91 in contact with the source/drain metal layer, and to form a second plate 92 on the dielectric layer 107 and independent of the anode metal layer 91. The first plate 42 and the second plate 92 form a storage capacitor.

Figure 9:
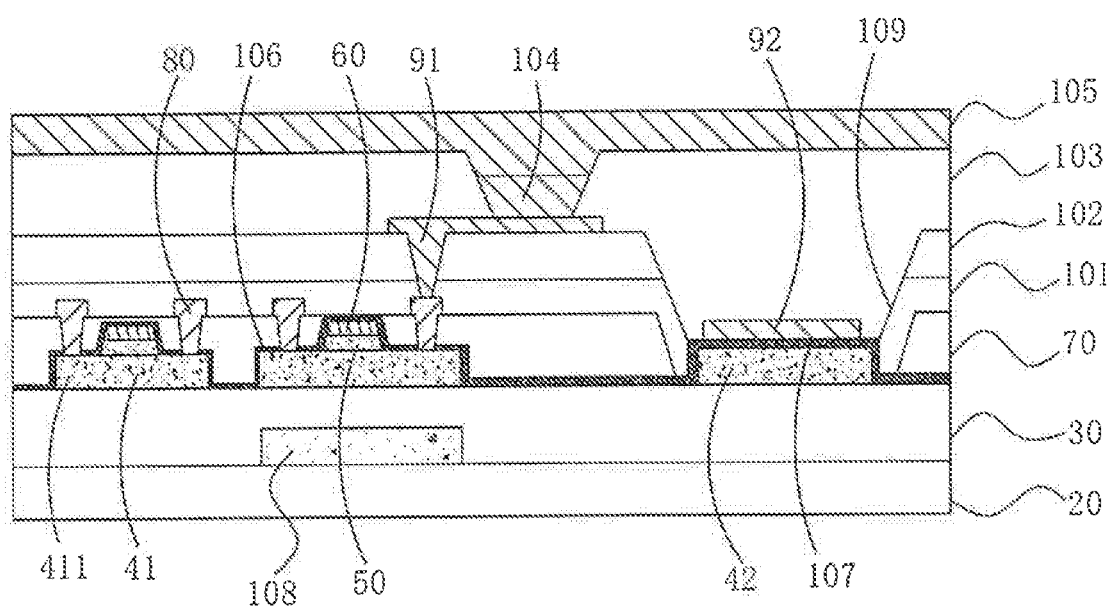

As shown in FIG. 9, a pixel defining layer 103 filling the opening 109 is formed on the planarization layer 102. A pixel opening is formed at a position on the pixel defining layer 103 corresponding to the anode metal layer 91. A light emitting layer 104 located in the pixel opening 109 is formed on the anode metal layer 91. A cathode metal layer 105 is formed on the light emitting layer 104.

Beneficial effects of the present application are that: indium gallium zinc oxide is converted from a semiconductor to a conductor by interdiffusion of an aluminum atom and an oxygen atom in the indium gallium zinc oxide to form a conductor layer 411. In addition, structurally dense aluminum oxide is formed on a surface of the conductor layer 411, indium gallium zinc oxide, indium tin oxide, and aluminum oxide are transparent conductive materials, so that a storage capacitor itself becomes transparent and can be widely applied in the field of transparent display. Moreover, the structure of the aluminum oxide is dense, and the conductor layer 411 and the first plate 42 can be well protected, so that the conductor layer 411 and the first plate 42 are protected from a subsequent thermal process. In addition, aluminum oxide has a high impedance and can increase the storage capacitance per unit area of the storage capacitor.

The above is only the preferred embodiment of the present application and is not intended to limit the application. A person skilled in the art can make various modifications and refinements without departing from the spirit and scope of the present invention, and the scope of the present invention is defined by the claims.

What is claimed is:

1. A method of manufacturing a display panel, comprising steps of:
    S10, forming a buffer layer on a substrate;
    S20, forming a patterned active layer on the buffer layer by using indium gallium zinc oxide, the active layer comprising an active island and a first plate independent of the active island;
    S30, sequentially forming a gate insulating layer and a gate metal layer on the active island;
    S40, conducting a portion of the active island exposing the gate insulating layer to form a conductor layer, simultaneously conducting the first plate, forming a protective layer covering the conductor layer, and forming a dielectric layer covering the first plate;
    S50, forming an interlayer dielectric layer covering the active layer and the gate metal layer;
    S60, forming a second metal layer on the interlayer dielectric layer, and patterning the second metal layer to form a source/drain metal layer in contact with the conductor layer;
    S70, forming a passivation layer and a planarization layer on the interlayer dielectric layer;
    S80, forming an anode metal layer in contact with the source/drain metal layer on the planarization layer by using indium tin oxide, and simultaneously forming a second plate on the dielectric layer to form a storage capacitor with the first plate; and
    S90, forming a light emitting layer and a cathode metal layer on the anode metal layer.

2. The method of manufacturing the display panel according to claim 1, wherein the step S40 comprises:
    S41, forming a thin film from aluminum and/or aluminum oxide on the first plate and the portion of the active island exposing the gate insulating layer; and
    S42, thermally annealing the thin film in an oxygen-containing environment, diffusing aluminum molecules into the first plate and the portion of the active island exposing the gate insulating layer to form the conductor layer where the portion of the active island exposes the gate insulating layer and to form the first plate being conductive and transparent, and simultaneously diffusing oxygen atoms in the active layer into the thin film to form the protective layer covering the conductor layer and to form the dielectric layer covering the first plate.

3. The method of manufacturing the display panel according to claim 2, wherein the protective layer is formed on the gate metal layer while forming the protective layer on the conductor layer.

4. The method of manufacturing the display panel according to claim 3, wherein the step S80 comprises:
    S81, forming a hole extending to a surface of the source/drain metal layer and an opening extending to the dielectric layer on the planarization layer; and
    S82, forming the anode metal layer filling the hole on the planarization layer by using indium tin oxide, and simultaneously forming the second plate on the dielectric layer in the opening to form the storage capacitor with the first plate.

\* \* \* \* \*